United States Patent
Fujimura

[15] 3,641,462
[45] Feb. 8, 1972

[54] L-C OSCILLATOR TUNABLE BY EXTERNAL DC VOLTAGE THROUGH PHASE SHIFTED FEEDBACK NETWORK

[72] Inventor: Noriaki Fujimura, Tokyo, Japan

[73] Assignee: Fujitsu Limited, Kawasaki-shi, Japan

[22] Filed: June 24, 1970

[21] Appl. No.: 49,295

[30] Foreign Application Priority Data

July 11, 1969 Japan....................................44/55304

[52] U.S. Cl........................................331/117 R, 331/177 R
[51] Int. Cl...........................................................H03b 5/12
[58] Field of Search..........................331/177 R, 117 R, 36 R

[56] References Cited

UNITED STATES PATENTS 3,551,846 12/1970 Hansen et al.......................331/117 R

*Primary Examiner*—Roy Lake
*Assistant Examiner*—Siegfried H. Grimm
*Attorney*—Robert E. Burns and Emmanuel J. Lobato

[57] ABSTRACT

An L-C oscillator circuit is tunable as a function of the value of an externally applied DC voltage. The phase of the resonant circuit is shifted 90° by a phase shifting circuit and the amplitude of the output of the phase shifting circuit is controlled by the externally applied DC voltage. A current, the amplitude of which is proportional to the controlled output of the phase shifting circuit is generated by a current generator and fed back to the resonant circuit. As this current is shifted 90° out of phase, the capacitive element of the resonant circuit is controlled by controlling the output of the phase shifter by means of the applied DC voltage. A wave shaping circuit may be used to convert the output of the phase shifting circuit from a sinusoidal to a square wave.

7 Claims, 5 Drawing Figures

INVENTOR

BY

ATTORNEY

L-C OSCILLATOR TUNABLE BY EXTERNAL DC VOLTAGE THROUGH PHASE SHIFTED FEEDBACK NETWORK

The present invention relates to an oscillator circuit in which the oscillation frequency thereof is controlled by applying a control voltage to the input of the oscillator circuit.

As for the oscillator circuit in which the oscillation frequency is controlled by applying a control voltage, many circuits have hitherto been used. The characteristic features required for such an oscillator circuit controlled by the applied voltage are mainly as follows:

1. The oscillation frequency for temperature variations is required to be stable.

2. The relation between the applied voltage and the oscillation frequency is required to be in a linear relation.

3. The frequency bandwidth, wherein the oscillation can be carried out, is required to extend over a wideband.

One of the conventional oscillator circuits controlled by the applied voltage uses a vari-cap diode. However, this type of vari-cap diode had such defects as the frequency bandwidth wherein the oscillation can be carried out, was relatively narrow at a low-frequency range and the frequency change for the applied voltage was in nonlinear relation. Another of the conventional oscillator circuits controlled by the applied voltage relates to utilize a change in the operation point of a transistor thereby changing the parameters of the transistor. This method also has such defects as poor stability and the change of the oscillation frequency was not proportional to the applied voltage. Still another method was the one using the charge and discharge of a capacitor. However, it had a defect in the point of stability.

An object of the present invention is to eliminate the above-mentioned drawbacks and provide an improved oscillator circuit for producing a frequency dependent on the applied voltage.

Another object of the present invention is to provide an improved oscillator circuit which converts a signal whose phase angle is 90° different from the oscillation voltage in the oscillator circuit to a square wave, controlling the amplitude of the square wave by the applied control voltage and directing a current which is proportional to the above-mentioned controlled square wave to the resonance circuit of the oscillator circuit, thereby controlling the oscillation frequency.

A further object of the present invention is to provide an improved oscillator circuit which controls a signal whose phase angle is 90° different from the oscillation voltage in the oscillator circuit by the applied control voltage and directing a current which is proportional to the above-mentioned controlled signal to the resonance circuit of the oscillator circuit, thereby controlling the oscillation frequency.

Further features and advantages of the present invention will be apparent from the ensuing description, reference being made to the accompanying drawings to which, however, the scope of the invention is in no way limited.

Figure 1:
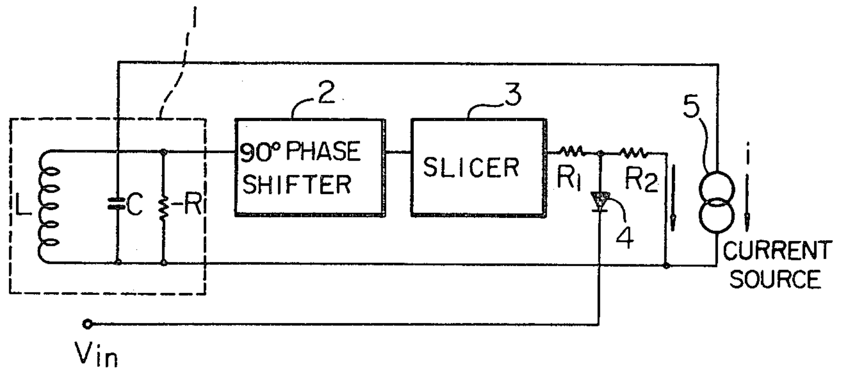
FIG. 1 is a block diagram of an embodiment of the present invention.
Figure 2A:
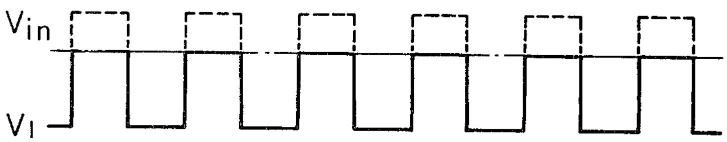
FIGS. 2A and 2B are diagrams showing waveforms of the present invention.

Referring to FIG. 1, the circuit 1 surrounded by the dotted line is an equivalent circuit of a general oscillation circuit. An inductance L and a capacitance C constitute a parallel resonance circuit and determine the oscillation frequency. A negative resistance −R represents an equivalent load resistance and supplies an energy of oscillation. The output of the oscillation circuit 1 is applied to the 90° phase shifter 2 and the phase of the output of the oscillation circuit 1 is shifted by 90°. The output of the 90° phase shifter 2 is applied to a wave shaper 3 which converts the output sinusoidal wave to a rectangular waveform. The rectangular waveform is clamped through a resistor $R_1$ by a diode 4 at the voltage level $V_{in}$ as shown in FIG. 2A. The clamped rectangular wave drives a current source 5 connected in parallel with the resonance circuit 1 of the oscillator circuit, through a resistor $R_2$. The current flowing through the current source 5 is proportional to the amplitude of the clamped rectangular voltage. The frequency component of this rectangular wave contains a fundamental wave and many higher harmonics. The phase of this fundamental wave is 90° apart in time from the oscillation voltage of the resonance circuit. Therefore, a current whose phase is 90° apart from the oscillation voltage will flow in parallel with the oscillation circuit. It follows that a reactance component is connected with said oscillation circuit equivalently. Accordingly, it is possible to change the oscillation frequency by changing the above-mentioned reactance component. Now, let $V_0$ and $I_0$ represent the amplitude voltage of the resonance circuit and the amplitude of the fundamental wave of the current through the current source 5, respectively, then the equivalent component of the reactance $X_0$ is expressed as $$X_0 = V_0/I_0 \quad (1)$$

If this reactance is capacitive, it follows that a capacitor is connected equivalently. Now taking $C_0$ as the value of the equivalent capacitor, $C_0$ is expressed as $$C_0 = I_0/2\pi f_0 V_0 \quad (2)$$

wherein $f_0$ is the oscillation frequency. As mentioned above, the current $I_0$ being proportional to the clamped rectangular wave, putting $K$ as a proportional constant, as it is clear from FIG. 2A, the following relation is obtained.

$$I_0 = K(V_{in} - V_1) \quad (3)$$

wherein $V_{in}$ is the applied control voltage and $V_1$ is the minimum value of the rectangular wave voltage. Therefore, Equation (2) is transformed to $$C_0 = (V_{in} - V_1)\, K/2\pi f_0 V_0 \quad (4)$$

As is clear from Equation (4), the value of a capacitor connected equivalently to the resonance circuit 1 in parallel has a linear relation with the applied control voltage $V_{in}$. This fact shows that, within the small range usually operated, the relation between the oscillation frequency $f_0$ and the applied voltage $V_{in}$ is a linear relation and that the control characteristic is good. The above-mentioned circuit receives comparatively few effects on the variation in its characteristics due to the temperature of a semiconductor, therefore, its operation is stable.

Figure 2B:
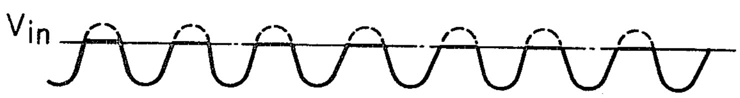

In the above-mentioned explanation, the same effect can be obtained without using the wave shaping circuit 3. In this case, a sinusoidal signal whose phase angle is 90° different from the oscillation voltage is clamped by the applied control voltage level $V_{in}$ as shown in FIG. 2B. The operation of the oscillator circuit is the same as explained above.

Figures 3, 4:
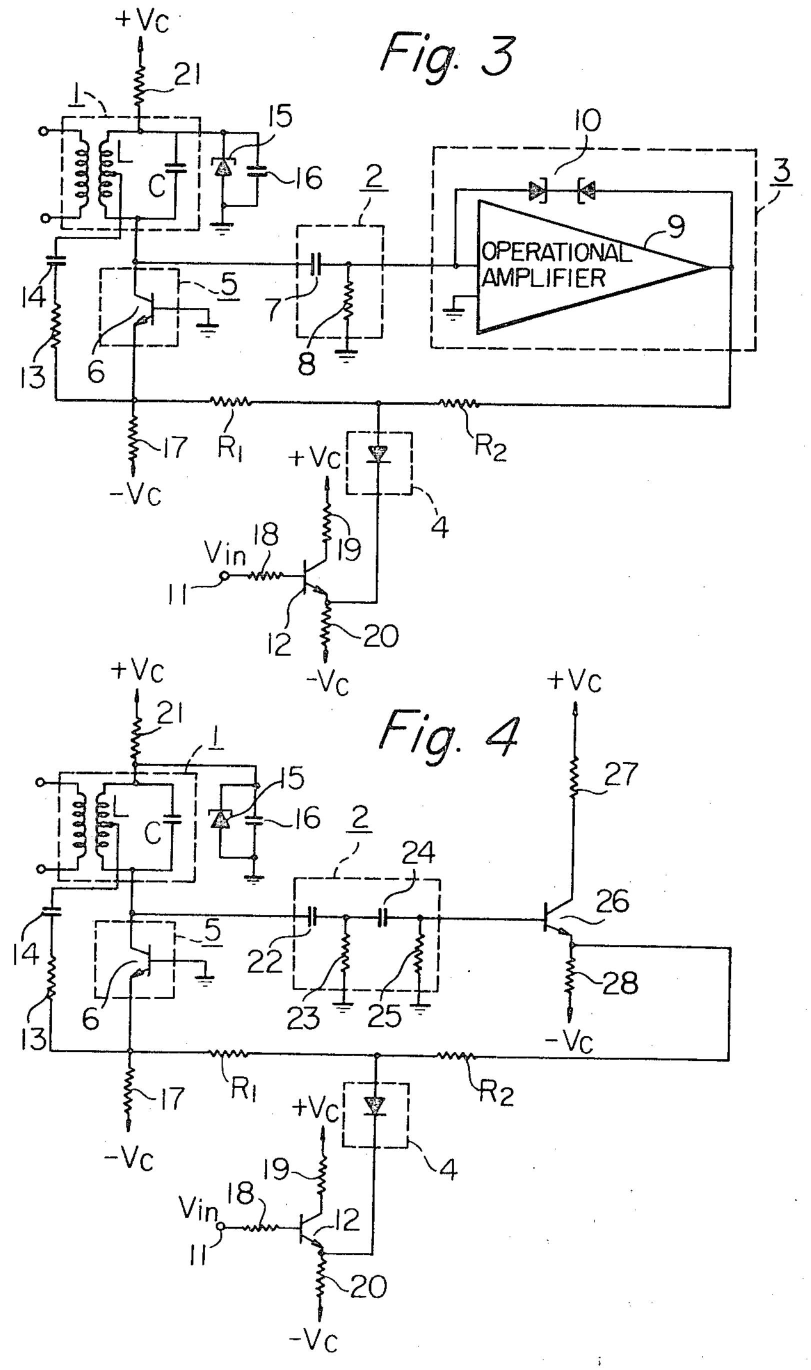
FIG. 3 is a circuit diagram of an embodiment of the present invention.
FIG. 4 is a circuit diagram of another embodiment of the present invention.

An embodiment of the invention is shown by way of example in FIG. 3. Referring to FIG. 3, one terminal of the parallel resonance circuit 1, which is composed of the inductance L and the capacitance C, is connected to the collector of a transistor 6 whose base is grounded. Another terminal of the resonance circuit 1 is connected through a resistor 21 to a positive potential source $+V_c$, and also connected through a parallel circuit containing a zener diode 15 and capacitor 16 to a ground. The emitter of the transistor 6 is connected through a resistor 17 to a negative potential source $-V_c$. The collector of the transistor 6 is connected through a capacitor 7 to one end of the resistor 8 whose other end is grounded. The connection point of the resistor 8 and the capacitor 7 is connected to one input terminal of an operational amplifier 9 whose other input terminal is grounded. A pair of zener diodes 10 is connected between one input terminal and an output terminal of the operational amplifier 9. The output terminal of the operational amplifier 9 is connected through resistor $R_2$ to an anode of the diode 4. On the other hand, an applied voltage input terminal 11 is connected through a resistor 18 to the base of a transistor 12 whose collector is connected through a resistor 19 to the positive potential source terminal $+V_c$. The emitter of the transistor 12 is connected to the cathode of the diode 4 and also connected through a resistor 20 to the negative potential source $-V_c$. A connection point of the resistor $R_2$ and the anode of the diode 4 is connected through a resistor $R_1$ to a connection point of the emitter of the transistor 6 and the resistor 17 and further, through a resistor 13 and a capacitor 14 to a middle tap of the inductance L of the resonance circuit 1.

Referring to FIG. 3, transistor 6 is an active element of the oscillator circuit and the inductance L and the capacitor C constitute the resonance circuit. An operational amplifier 9 and a pair of zener diodes 10 compose a wave shaping circuit, that is the wave shaping circuit 3. Being applied to a negative feedback circuit, the input impedance of the wave shaper is very low, then the phase of the current passing through the capacitor 7 is shifted by 90° from the oscillation voltage of the resonance circuit. The control voltage $V_{in}$, passing through the emitter follower of the transistor 12, is applied to the clamping diode 4. Of course, the control voltage can be applied directly to the clamping diode 4 without passing through the transistor 12.

FIG. 4 shows another modified embodiment of the invention. Referring to FIG. 4, a connection point of the resonance circuit 1 and the collector of the transistor 6 is connected through a 90° phase shift circuit 2 composed of capacitors 22, 24 and resistors 23, 25 to the base of a transistor 26 whose collector is connected through a resistor 27 to the positive potential source $+V_c$. An emitter of the transistor 26 is connected through a resistor 28 to the negative potential source $-V_c$ and the output of the emitter follower is connected through a resistor $R_2$ to a connection point of a resistor $R_1$ and the anode of the diode 4. By using the circuit shown in FIG. 4, the same effect as shown in FIG. 3 can be obtained without using the wave shaping circuit 3. Another operation of the oscillator circuit shown in FIG. 4 is the same as the circuit in FIG. 3.

As in the foregoing description, the present invention renders it possible to obtain an oscillator whose oscillation frequency is stable and well dependent on an applied voltage.

Modification of the herein disclosed circuit will occur to those skilled in the art and various combinations of the circuit will be capable of use together for achieving the desired results of the invention. The scope of the invention is to be interpreted accordingly as defined by the appended claims.

What is claimed is:

1. An oscillator circuit comprising a resonant circuit composed of an inductance and a capacitance, phase shifting means for shifting the oscillation signal of said resonant circuit by 90°, means for applying an external DC voltage to control the amplitude of the output of said phase shifting means, a current generator generating a current the amplitude of which is proportional to the amplitude of the output of said phase shifting means as controlled by said external DC voltage and means for applying said current to said resonant circuit and thereby controlling the oscillation frequency as a function of said external DC voltage.

2. An oscillator circuit according to claim 1, further comprising wave shaping circuit means connected to the output of said phase shifting means for shaping the output signal thereof.

3. An oscillator circuit according to claim 2, in which said wave shaping circuit means shapes a sinusoidal wave into a square wave.

4. An oscillator circuit according to claim 2, in which said wave shaping circuit comprises two Zener diodes arranged back-to-back and connected in parallel with an operational amplifier.

5. An oscillator circuit according to claim 1, in which said current generator comprises a transistor having a current flow controlled by the output voltage of said phase shifting means controlled by said external DC voltage.

6. An oscillator circuit according to claim 5, in which said inductance has a center tap and in which said transistor has a grounded base, a collector connected to said resonant circuit between said inductance and said capacitance and to the input of said phase shifting means, and an emitter connected through a resistor to a negative voltage supply, to the voltage controlled output of said phase shifting means and through a series connected resistor and a capacitor to said center of said inductance.

7. An oscillator according to claim 1, in which said means for applying an external DC voltage to control the output of said phase shifting means comprises an external DC voltage supply, a diode, and a transistor having a base connected to said voltage supply and an emitter connected through said diode to the output of said phase shifting means.

* * * * *